US012628597B2

(12) United States Patent
   Shariff et al.

(10) Patent No.: US 12,628,597 B2
(45) Date of Patent: May 12, 2026

(54) FRAME MASK FOR SINGULATING WAFERS BY PLASMA ETCHING

(71) Applicant: UTAC Headquarters Pte. Ltd., Singapore (SG)

(72) Inventors: Dzafir Bin Mohd Shariff, Singapore (SG); Il Kwon Shim, Singapore (SG); Enrique E. Sarile, Jr., Singapore (SG); Jackson Fernandez Rosario, Singapore (SG); Ronnie M. De Villa, Singapore (SG); Chan Loong Neo, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 481 days.

(21) Appl. No.: 18/054,547

(22) Filed: Nov. 11, 2022

(65) Prior Publication Data

US 2023/0154795 A1      May 18, 2023

Related U.S. Application Data

(60) Provisional application No. 63/278,489, filed on Nov. 12, 2021.

(51) Int. Cl.
   *H01L 21/78*      (2006.01)
   *H01L 21/308*      (2006.01)
(52) U.S. Cl.
   CPC .......... *H01L 21/78* (2013.01); *H01L 21/3081* (2013.01); *H01L 21/3085* (2013.01); *H01L 21/3086* (2013.01)

(58) Field of Classification Search
   CPC ............. H01L 21/3081; H01L 21/3086; H01L 21/3085; H01L 21/78; H01L 21/68742; H01L 21/67092; H01J 37/32651; H01J 37/32366
   See application file for complete search history.

(56) References Cited

U.S. PATENT DOCUMENTS 5,208,066 A * 5/1993 Fujisaki ................. B82Y 40/00
                                                        438/953
2011/0027463 A1* 2/2011 Riordon ................ H10F 10/146
                                                        427/75

FOREIGN PATENT DOCUMENTS

JP            2005332844 A  * 12/2005

* cited by examiner

*Primary Examiner* — Yuechuan Yu
(74) *Attorney, Agent, or Firm* — Horizon IP Pte. Ltd.

(57)            ABSTRACT
The present disclosure relates to plasma dicing of wafer. More specifically, the present disclosure is directed to frame masks and methods for plasma dicing wafers utilizing frame masks. The frame mask includes a mask frame, wherein the mask frame includes a top ring mask support and a side ring mask support. A plurality of mask segments suspended from the top ring mask support by segment supports, the mask segments are configured to define dicing channels on a blank wafer. The frame mask is configured to removably sit onto a frame lift assembly in a plasma chamber of a plasma dicing tool, when fitted onto the frame lift assembly, the mask segments are disposed above a wafer on a wafer ring frame for plasma dicing. The mask frame is configured to enable flow of plasma therethrough to the wafer to etch the wafer to form dicing channels defined by the mask segments.

19 Claims, 14 Drawing Sheets

230

260

250

202

510    Position frame masks in plasma chambers

520    Position wafer in first plasma chamber

530    Plasma processing

540    Position wafer in second plasma chamber

550    Plasma processing

560    Singulation completed

500

610    Position frame mask in plasma chamber

620    Position wafer in plasma chamber

630    Plasma processing

640    Reposition frame mask in plasma chamber

650    Plasma processing

660    Singulation completed

600

710   Position frame mask in plasma chamber

720   Position wafer in plasma chamber

730   Plasma processing

740   Rotate wafer

750   Plasma processing

760   Singulation completed

700

810 | Position frame mask in plasma chamber

820 | Position wafer in plasma chamber

830 | Plasma processing

840 | Singulation completed

800

FRAME MASK FOR SINGULATING WAFERS BY PLASMA ETCHING

CROSS-REFERENCE TO RELATED APPLICATION

This application claims the benefit of U.S. Provisional Application Ser. No. 63/278,489, filed on Nov. 12, 2021, which is incorporated by reference in its entirety for all purposes.

FIELD OF THE INVENTION

The present disclosure generally relates to plasma dicing of semiconductor wafers. More specifically, the present disclosure is directed to frame masks and methods for utilizing the frame masks for plasma dicing.

BACKGROUND

In semiconductor processing, a wafer is processed to form a plurality of devices thereon. After the devices are formed, the wafer is diced to separate the devices into individual dies. Conventional techniques for dicing employ the use of a dicing saw. The saw cuts the wafer along the x-direction and the y-direction saw lines, one at a time, to separate the wafer into individual dies. Sawing, however, takes time, which slows down the processing throughput. In addition, mechanical sawing causes vibration when cutting the wafer. The vibration may cause cracks in the dies, such as the back-end dielectric, which may impact yields negatively.

To combat the issues of sawing, plasma dicing has been investigated. Plasma dicing entails mounting a wafer onto a wafer ring and inserting the wafer ring with the wafer into a plasma chamber for etching. Unlike mechanical sawing, the plasma etch process singulates the wafer into individual dies in a single plasma etch step without any vibration issues. This significantly improves throughput as well as avoids reliability issues due to cracking. In addition, plasma dicing avoids vibration which may cause cracking in the dies.

However, plasma dicing requires pre and post-plasma dicing processes. The pre-plasma dicing process includes a coating process that forms a hard mask layer, such as a silicon oxide layer on the wafer, and a patterning process to form the hard mask. The patterning process includes laser etching. Laser etching requires individual laser cuts in the x-direction and the y-direction to form the etch mask used for plasma dicing. Laser etching tools are quite expensive and laser etching is time-consuming due to the required individual cuts. As for the post-plasma dicing process, it includes removing the mask, further incurring additional processing time.

Based on the foregoing discussion, there is a desire to provide fast and economical plasma dicing processes.

SUMMARY

Frame masks, including systems and methods thereof, are disclosed. In one embodiment, a frame mask for plasma dicing wafers includes a mask frame, wherein the mask frame includes a top ring mask support and a side ring mask support. A plurality of mask segments suspended from the top ring mask support by segment supports, the mask segments are configured to define dicing channels on a blank wafer. The frame mask is configured to removably sit onto a frame lift assembly in a plasma chamber of a plasma dicing tool, when fitted onto the frame lift assembly, the mask segments are disposed above a wafer on a wafer ring frame for plasma dicing. The mask frame is configured to enable flow of plasma therethrough to the wafer to etch the wafer to form dicing channels defined by the mask segments.

In another embodiment, a method for plasma dicing a wafer utilizing a frame mask includes providing a frame mask in a plasma chamber, the frame mask includes a mask frame for supporting a plurality of mask segments configured to define dicing channels of a wafer. A wafer frame ring assembly with a wafer for plasma dicing on wafer ring assembly holder of a frame lift assembly is disposed in a plasma chamber of a plasma dicing tool. The frame mask is placed onto a frame lift ring on a top of the frame lift assembly, wherein the mask segments are disposed over the wafer. The frame lift assembly is lowered so that the wafer on the wafer ring frame assembly is fixed to an electrostatic chuck in the plasma chamber. The method also includes performing plasma dicing of the wafer in the plasma chamber.

In yet another embodiment, a method for plasma dicing wafers utilizing frame masks includes providing a first frame mask in a first plasma chamber and a second frame mask in a second plasma chamber, the first and second frame masks include a mask frame for supporting a plurality of mask segments configured to define dicing channels of a wafer, the first frame mask is configured to provide plasma dicing channels in a first direction, and the second frame mask is configured to provide plasma dicing channels in a second direction. A wafer frame ring assembly with a wafer for plasma dicing is mounted on wafer ring assembly holder of a frame lift assembly disposed in the first plasma chamber of a plasma dicing tool. The first frame mask is placed onto a frame lift ring on a top of the frame lift assembly, wherein the mask segments are disposed over the wafer. The frame lift assembly is lowed so that the wafer on the wafer ring frame assembly is fixed to an electrostatic chuck in the first plasma chamber. The method also includes performing plasma dicing of the wafer in the first plasma chamber. The wafer frame ring assembly with the wafer for plasma dicing is mounted on wafer ring assembly holder of a frame lift assembly disposed in the second plasma chamber of a plasma dicing tool. The second frame mask is placed onto a frame lift ring on a top of the frame lift assembly, wherein the mask segments are disposed over the wafer. The frame lift assembly is lowered so that the wafer on the wafer ring frame assembly is fixed to an electrostatic chuck in the second plasma chamber. The method further includes performing plasma dicing of the wafer in the second plasma chamber.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, with emphasis instead generally being placed upon illustrating the principles of the invention. In the following description, various embodiments of the present invention are described with reference to the following drawings, in which.

DETAILED DESCRIPTION

Embodiments relate to frame masks and methods for utilizing frame masks for plasma dicing. Frame masks for plasma dicing improve cost efficiency with reusable pattern designs and reduce cycle time by avoiding the need to coat a mask before plasma dicing and remove the mask thereafter.

Figure 1A:
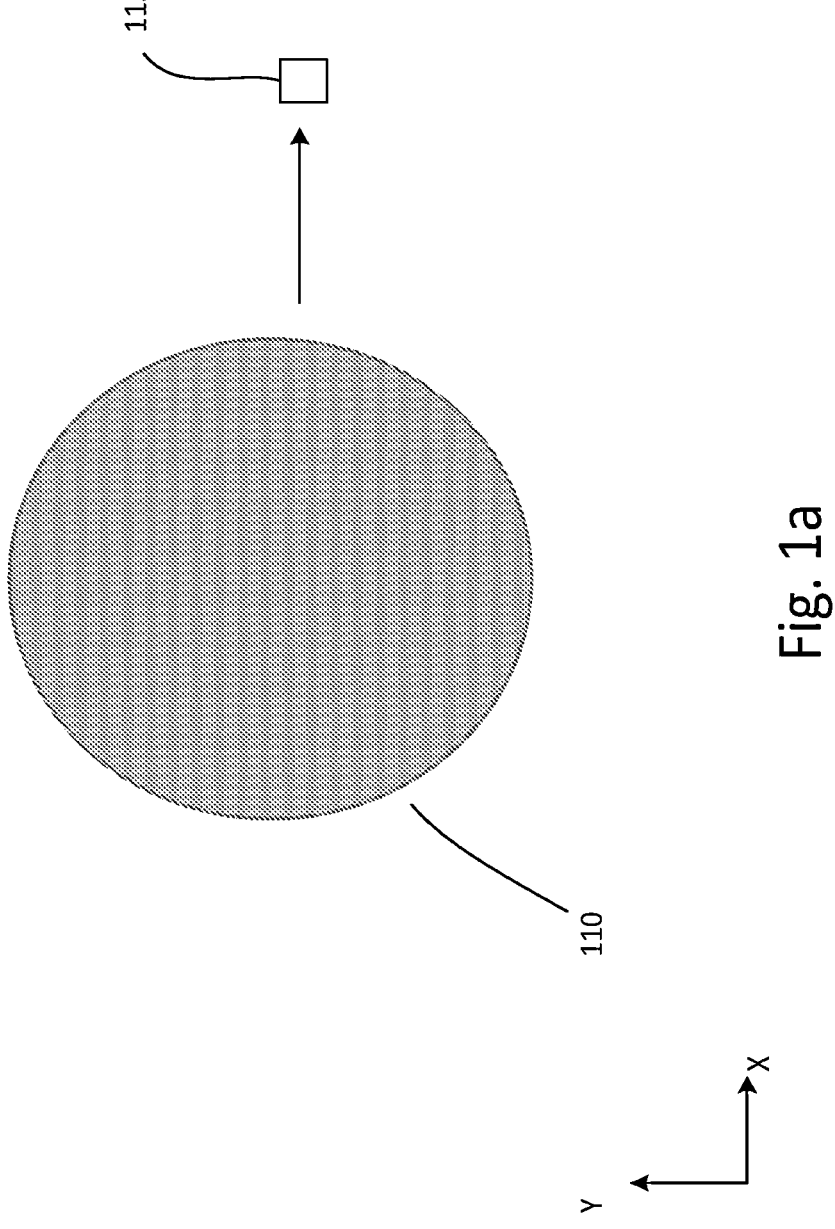
FIG. 1a shows a simplified top view of an embodiment of a blank wafer.

FIG. 1a shows a top view of an embodiment of a wafer 110. The wafer 110, in one embodiment, is a blank or unprocessed wafer with opposing major surfaces. For example, the wafer does not include a plurality of processed dies arranged in rows (x-direction) and columns (y-direction). As such, the wafer does not include any passivation stack. In one embodiment, the wafer is processed by plasma dicing to form blank dies 115. As shown, the blank dies are rectangular-shaped blank dies. Dicing the wafer to form other shaped or sized blank dies, such as circular, square, hexagonal or other geometric shapes, may also be useful. In one embodiment, the blank wafer is processed by plasma dicing to singulate it into a plurality of blank dies. For example, the blank wafer is plasma diced to singulate the blank wafer into individual blank dies.

The blank dies may be used for various purposes. One purpose may include the blank dies serving as mechanical support structures for processed or active dies to improve the active dies' mechanical integrity. Other purposes for the blank dies may also be useful.

Figure 1B:
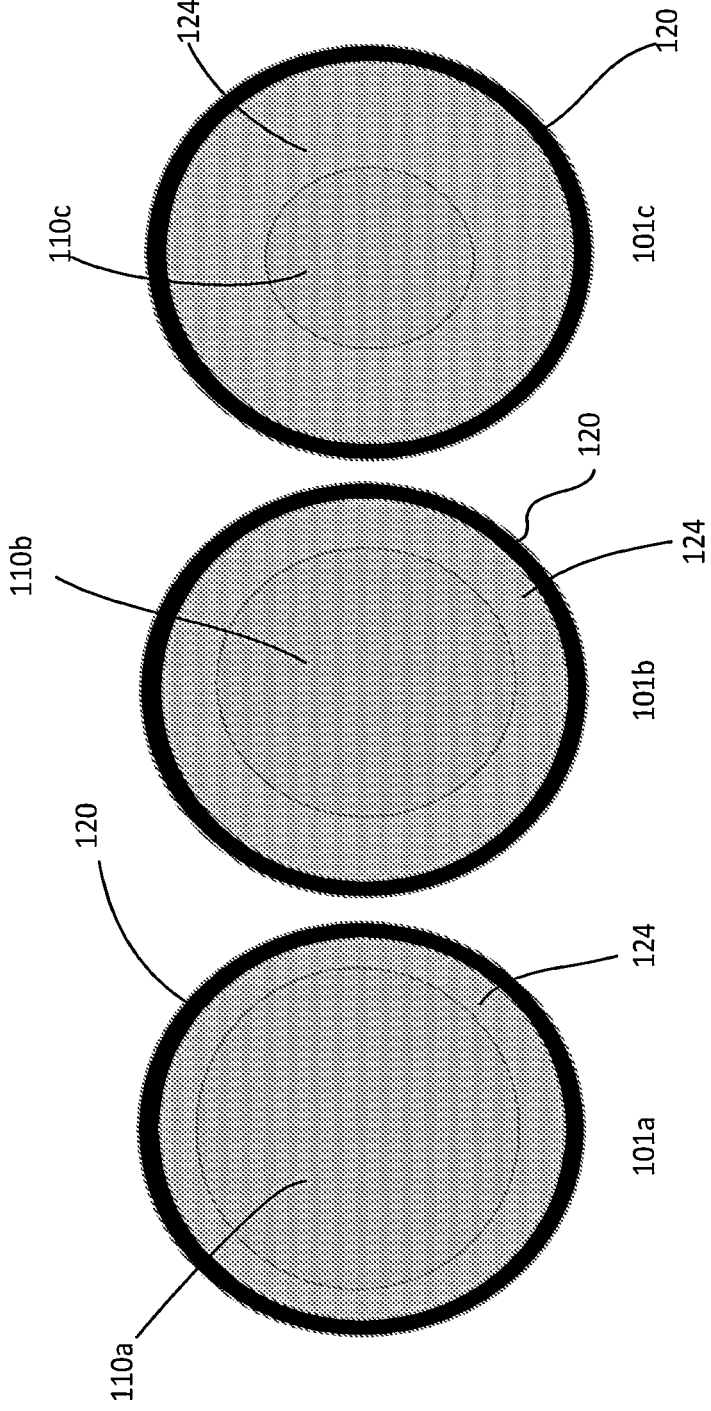
FIG. 1b shows simplified top views of a wafer tape frame assembly mounted with different different-sized blank wafers used for plasma dicing.

FIG. 1b shows simplified top views of a wafer tape frame assembly mounted with different different-sized blank wafers used for plasma dicing. A wafer tape frame assembly 101a is shown. The wafer tape frame assembly includes a wafer tape frame 120 with an adhesive wafer tape 124 attached thereto. As shown, the wafer tape ring is shown as a circular ring frame with a circular ring opening within the ring frame. For example, inner and outer circumferences are circular. Other configurations of the tape frame may also be useful. For example, the inner and/or other circumferences may not be completely circular. In addition, the tape frame may include alignment markers. The wafer tape is fixed to, for example, a surface, such as the bottom surface, of the tape ring. The wafer tape fills the ring opening. The wafer tape frame accommodates a wafer 110a. For example, the wafer is aligned to the tape frame assembly and attached thereto by the adhesive wafer tape.

For plasma dicing, wafer tape frame assemblies are specifically configured for a specific-sized wafer. Different sized frame assemblies are provided for different sized wafers. As shown, the wafer tape frame assembly 101a is specifically configured to fit a 12" wafer. For example, the ring opening of the wafer tape frame 120 is specifically configured to fit a 12" sized wafer. A specified gap exists between the wafer's outer edge and the inner edge of the wafer tape frame. In one embodiment, the wafer attached to the wafer tape frame assembly is a blank 12" sized wafer. In one embodiment, the blank wafer does not need to be perfectly aligned with the wafer frame assembly. The tape frame with the wafer is configured to mount onto an electrostatic chuck (ESC) in a plasma chamber for processing.

A second wafer frame assembly 101b is shown. As shown, the wafer frame assembly includes a wafer frame 120 with an adhesive wafer frame tape 124. The wafer frame assembly is configured for a 12" sized wafer. However, as shown, an 8" inch sized blank wafer 110b is attached to the second wafer frame assembly. As such, the wafer frame assembly can accommodate non-specifically sized blank wafers. Furthermore, the blank wafer need not be perfectly aligned with the wafer frame assembly.

Similarly, a third wafer frame assembly 101c, which is configured for a 12" sized wafer, is mounted with a 6" sized wafer 110c. The blank wafer need not be perfectly aligned with the wafer frame assembly.

Figure 2A:
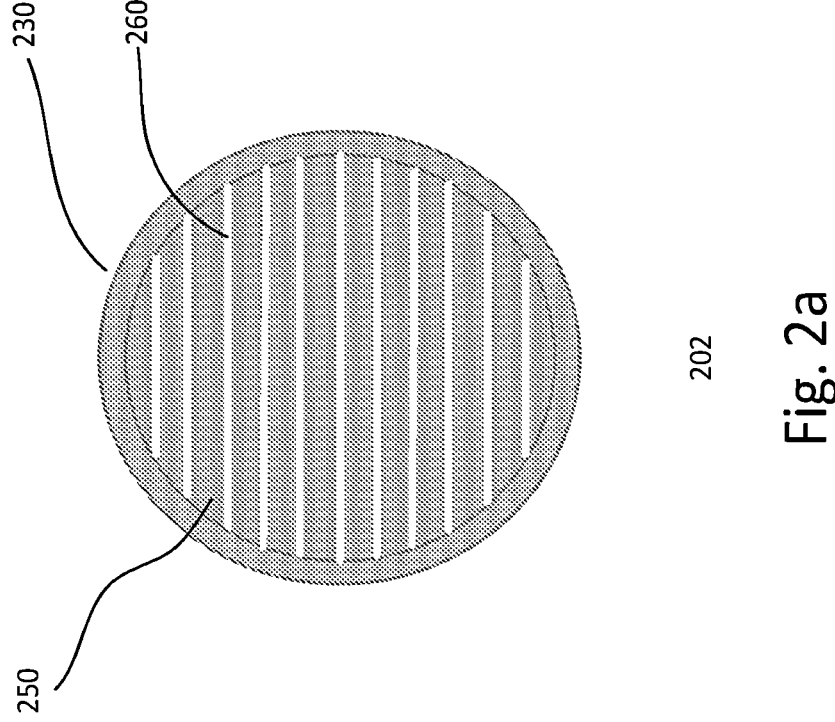
FIGS. 2a-2b show simplified top views of embodiments of a frame mask used for plasma dicing.
Figure 2B:
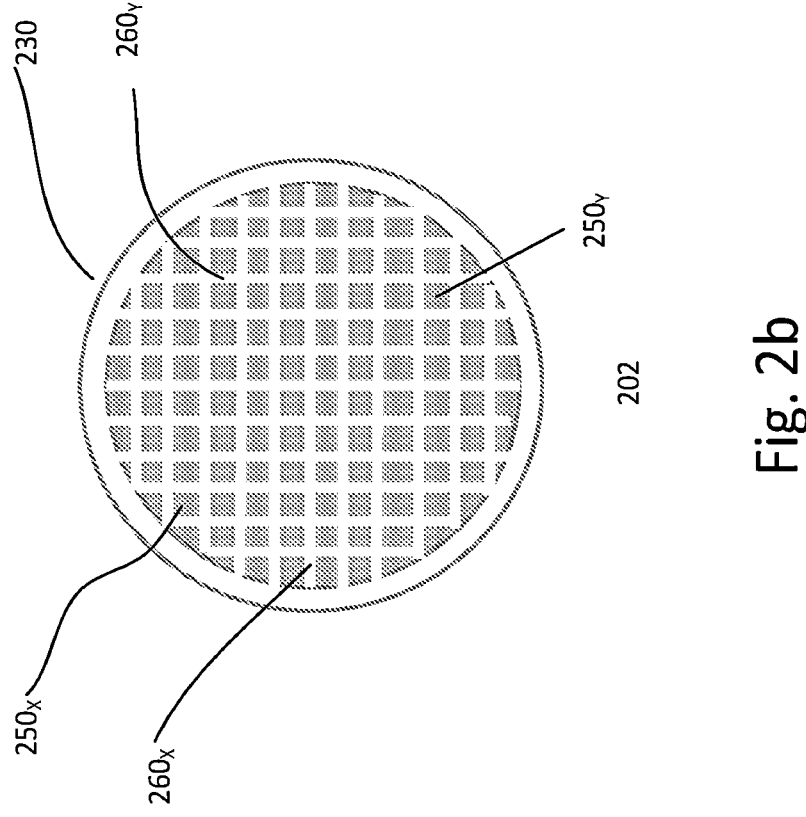

FIGS. 2a-2b show simplified top views of embodiments of a frame mask 202 used for plasma dicing. The frame mask, in one embodiment, is a physical mask which is disposed over the blank wafer in the plasma chamber. With the frame mask, there is no need for pre-plasma dicing processing, such as forming a hard mask (coating and patterning) and post-plasma dicing processing, such as removing the hard mask. This improves cycle time. Furthermore, unlike coated masks used in plasma processing, the frame mask is reusable. For example, the same frame mask can be used over and over again for plasma dicing wafers.

Referring to FIG. 2a, an embodiment of a frame mask 202 is shown. The frame mask, in one embodiment, is configured for a two-step plasma etch process for singulating a blank wafer into individual blank dies. For example, a first etch process is performed to form first directional cuts (x-direction or y-direction) and a second etch process in which the mask is rotated 90° to form second directional cuts (y-direction or x-direction) is performed to complete the plasma singulation process. The wafer frame is configured to enable plasma to pass through the frame mask to etch the wafer. In addition, the wafer frame assembly can accommodate blank wafers of different sizes as well as avoid the need to have the wafer perfectly aligned thereto. As such, further cost savings can be achieved due to wafer frame flexibility.

In one embodiment, the frame mask includes a mask frame 230. The mask frame is configured to support mask segments 250 which define plasma dicing channels 260 in the first direction. As shown, the mask segments are elongated members separated by spaces defining the plasma dicing channels. The mask segments are elongated rectangular-shaped members. For example, the mask segments are configured to form rectangular-shaped blank dies. Forming other shaped blank dies may be achieved by tuning the shapes of the mask segments.

Figure 2C:
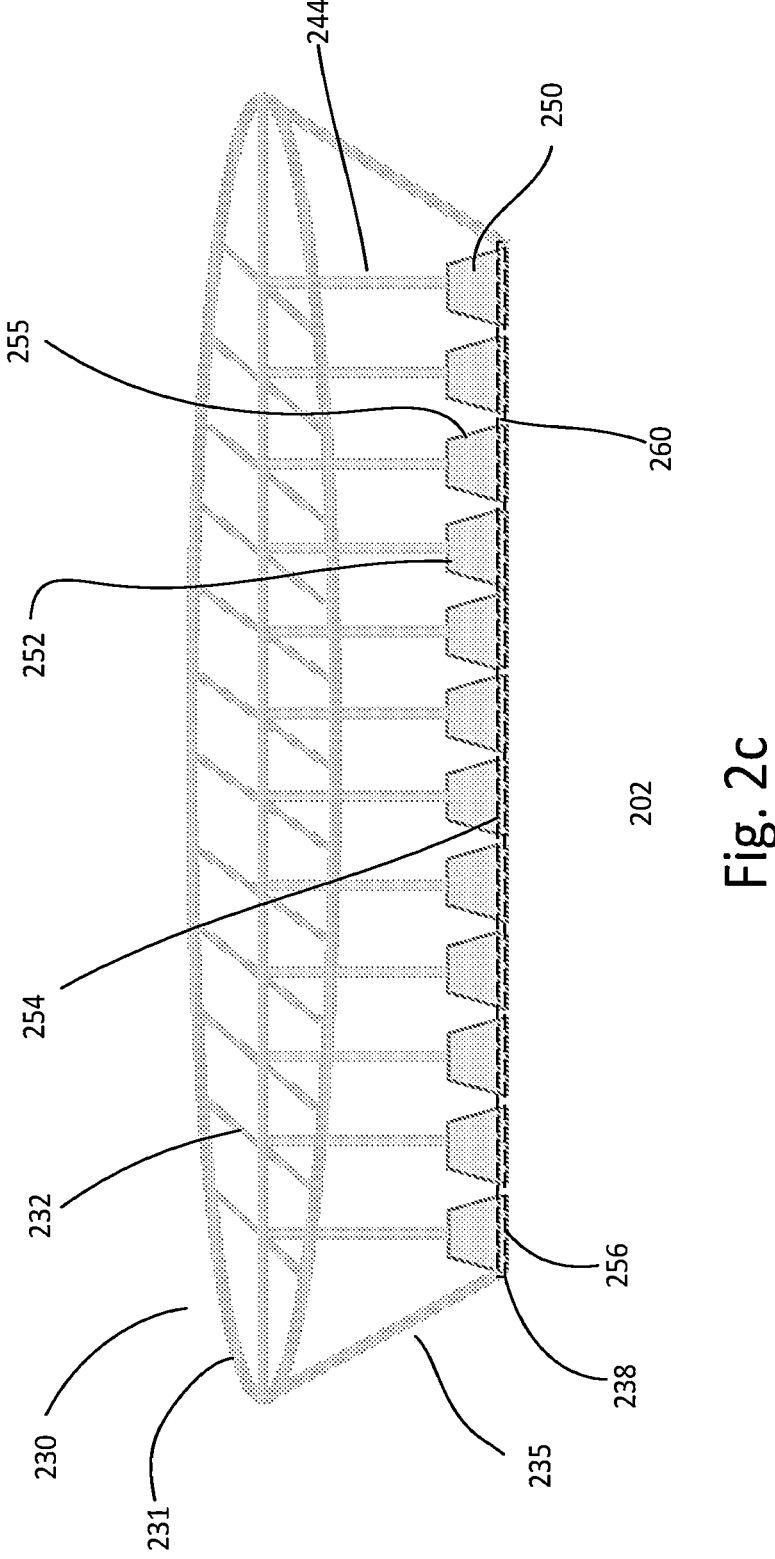
FIG. 2c shows a simplified 3D view of embodiments of frame masks.

In one embodiment, a mask segment includes a top segment surface 252, a bottom segment surface 254 and side segment surfaces 255, as shown in FIG. 2c. In one embodiment, the top segment surface is smaller than the bottom segment surface, resulting in slanted side segment surfaces. The slanted side segment surfaces facilitate the flow of plasma to the dicing channels for dicing the wafer.

The mask frame is also configured or adapted to fit in a plasma chamber and to be disposed over a wafer tape frame assembly for plasma dicing of the wafer. In particular, the mask frame is configured to fit into a conventional plasma dicing tool with minimal customization or no changes at all. In one embodiment, existing plasma dicing tools include support structures to which the mask frame can be adapted. For example, the mask frame can be adapted to an existing frame lift ring of a plasma dicing tool. In one embodiment, the mask frame includes a sloping mask frame side support 235 configured to fit onto the frame lift ring of the plasma etch tool. Alternatively, the mask frame can be fitted with a support adaptor which is configured to fit onto an existing support structure, such as a frame lift frame, of the plasma dicing tool. Other configurations of adapting the mask frame to the plasma dicing tool may also be useful.

In one embodiment, the mask frame enables plasma to pass through to etch the wafer on the wafer frame assembly. For example, the mask frame includes a grid-patterned top ring portion or support 231 to support the mask segments as well as a grid-patterned side support to facilitate plasma passing through to the wafer to etch the wafer. By grid-patterned, it refers to the presence of openings between support structures to enable plasma to pass through. The pattern of the grid may be any pattern. In one embodiment, the frame mask includes a bottom ring support 238. The top ring support 231, side support 235 and bottom ring support 238 form the frame mask. The interconnected components of the frame mask increase the frame mask's structural integrity. Other configurations of the frame mask or mask frame may also be useful.

When placed over the wafer frame assembly with the blank wafer, a first plasma etch process forms cuts along the dicing channels in a first direction. After the first plasma etch process, the wafer frame assembly or frame mask is rotated 90°. A second plasma etch process is performed to form cuts along the dicing channels in the second direction. The second direction is orthogonal to the first direction. The second etch process completes the singulation process. In one embodiment, the singulation process using the frame mask produces individual dies with smooth and straight sidewalls. The blank dies are economically produced with high throughput. For example, the blank dies are produced without the need of conventional pre-plasma and post-plasma dicing processes. In addition, the blank dies can be configured to have any size and shape.

The frame mask, in one embodiment, is formed of a rigid material. Preferably, the frame mask is formed of a similar or the same material as the frame lift frame of the plasma etch tool. Such a configuration produces consistency in thermal expansion. For example, a mismatch in thermal expansion is avoided. In one embodiment, the mask frame is formed with Aluminum (Al). Other types of rigid materials may also be employed.

Referring to FIG. 2b, another embodiment of the mask frame 202 is shown. The mask frame is similar to the mask frame of FIG. 2a. Common elements may not be described or described in detail.

The frame mask, in one embodiment, is configured for a single-step plasma etch process for singulating a blank wafer into individual blank dies. For example, the single plasma etch process singulates the wafer into individual blank dies.

The wafer frame is configured to enable plasma to pass through the frame mask to etch the wafer. In addition, the wafer frame assembly can accommodate blank wafers of different sizes as well as avoid the need to have the wafer perfectly aligned thereto. As such, further cost savings can be achieved due to wafer frame flexibility.

In one embodiment, the frame mask includes a mask frame 230. The mask frame is configured to support mask segments 250 which are configured to define plasma dicing channels 260 in first and second orthogonal directions (x-direction and y-direction). In one embodiment, mask segments include first direction mask segments (e.g., x-direction) 250$_x$ and second direction mask segments 250$_y$ (e.g., y-direction), forming first direction dicing channels 260$_x$ and second direction dicing channels 260y. The mask segments, in one embodiment, are mask segment blocks corresponding to blank dies. For example, the mask segment blocks, after dicing, singulate the blank wafer into blank dies with a single plasma dicing process. The shape of the mask segment blocks corresponds to the shape of the blank dies. The mask segment blocks, for example, are suspended from the top ring support via segment supports 244.

In one embodiment, a mask segment block includes a top segment surface 252, a bottom segment surface 254 and side segment surfaces 255. In one embodiment, the top segment surface is smaller than the bottom segment surface, resulting in slanted side segment surfaces. The slanted side segment surfaces facilitate the flow of plasma to the dicing channels for dicing the wafer.

When placed over the wafer frame assembly with the blank wafer, a plasma etch process forms cuts in the dicing channels exposed by the mask segment blocks. The etch process singulates the blank wafer into individual blank dies according to the shape of the segment blocks of the frame mask. In one embodiment, the singulation process using the frame mask produces individual dies with smooth and straight sidewalls.

Referring to FIG. 2c, a simplified 3-D view of frame mask 202 is shown. The mask frame, for example, is similar to those described in FIGS. 2a-2b. Common elements may not be described or described in detail.

The frame mask includes a mask frame 230. The mask frame, in one embodiment, includes a top frame or ring support 231, side ring support 235 and a bottom ring support 238. In one embodiment, mask segments 250 are provided. The mask segments 250 are attached or suspended from the top ring support by mask segment supports 244.

In one embodiment, the mask segments are configured to define plasma dicing channels 260 along a first direction of the frame mask. The mask segments, for example, are elongated members along the first direction. The gaps between the adjacent members form the dicing channels. In one embodiment, the elongated members are rectangular-shaped elongated members. With rectangular-shaped members in the first direction, the frame mask is configured to form rectangular-shaped blank dies after first and second plasma dicing processes. In one embodiment, the frame mask or the frame support in the plasma chamber is rotated by 90° for the second plasma etch process. Forming other shaped dies may also be useful. For example, sides of the elongated segment members may have the desired shapes to form the desired shaped blank dies. Of course, the shapes formed by the elongated segment members may be limited to what shapes can be formed using two plasma etch processes with the same shaped elongated segment members. In such cases, the elongated members are not rectangular-shaped members. In one embodiment, a bottom surface of the mask segments is coated with a heat resistant layer 256. For example, the bottom surface of the elongated members is coated with the heat resistant layer. The heat resistant layer, for example, may be a high temperature silicone rubber material layer. Other types of heat resistant layers may also be useful. The heat resistant layer is able to withstand the plasma chamber process conditions, including the high temperature of the process.

In other embodiments, the mask segments are configured to form blank dies of the desired shape using a single plasma dicing process. For example, the mask segments are mask segment blocks having the desired shape corresponding to the shape of the blank dies. Gaps between adjacent mask segment blocks define dicing channels in first and second orthogonal directions or generally along first and second directions. For example, in the case of rectangular shaped blank dies, the gaps between adjacent mask segment blocks define dicing channels along the first and second orthogonal directions. In the case that the dies are not rectangular-shaped, the gaps may define dicing channels which are generally along first and second orthogonal directions. In one embodiment, a bottom surface of the mask segments is coated with a heat resistant layer. For example, a bottom surface of the segment blocks is coated with the heat resistant layer. The heat resistant layer, for example, may be a high temperature silicone rubber material layer. Other types of heat resistant layers may also be useful. The heat resistant layer is able to withstand the plasma chamber process conditions, including the high process temperature.

The frame mask is configured for plasma to pass through to etch the wafer. In one embodiment, the mask frame is an opened mask frame which enables the plasma to pass through to define the blank dies on the blank wafer according to the mask segments. In one embodiment, the top support ring includes an outer top ring with ring support members 232 which form a grid pattern. Segment supports 244 are connected to the ring support members, supporting the mask segments. Side ring support members extend from the top support ring to the bottom support ring. For example, the top and bottom support rings are connected by the side ring support members. In one embodiment, the top ring is larger in diameter than the bottom ring to form slanted side supports. In one embodiment, to increase flow of plasma to the wafer, the mask segments are not connected to the bottom support ring. For example, a gap exists between the mask segments and the bottom ring support. Other configurations of the mask frame may also be useful.

Figure 3A:
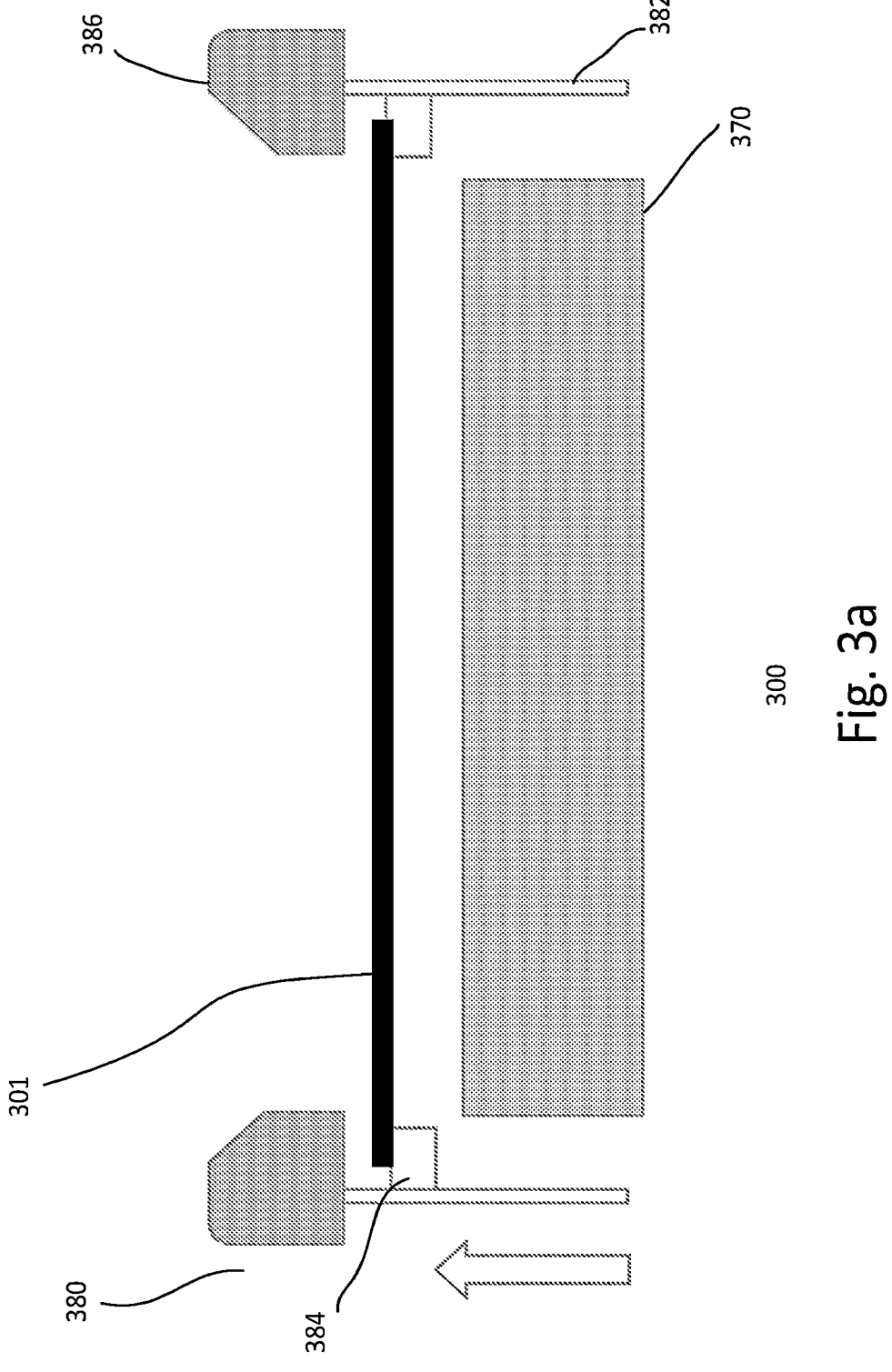
FIGS. 3a-3c show simplified views illustrating plasma dicing of a wafer in a plasma etch chamber of a plasma wafer dicing tool.
Figure 3B:
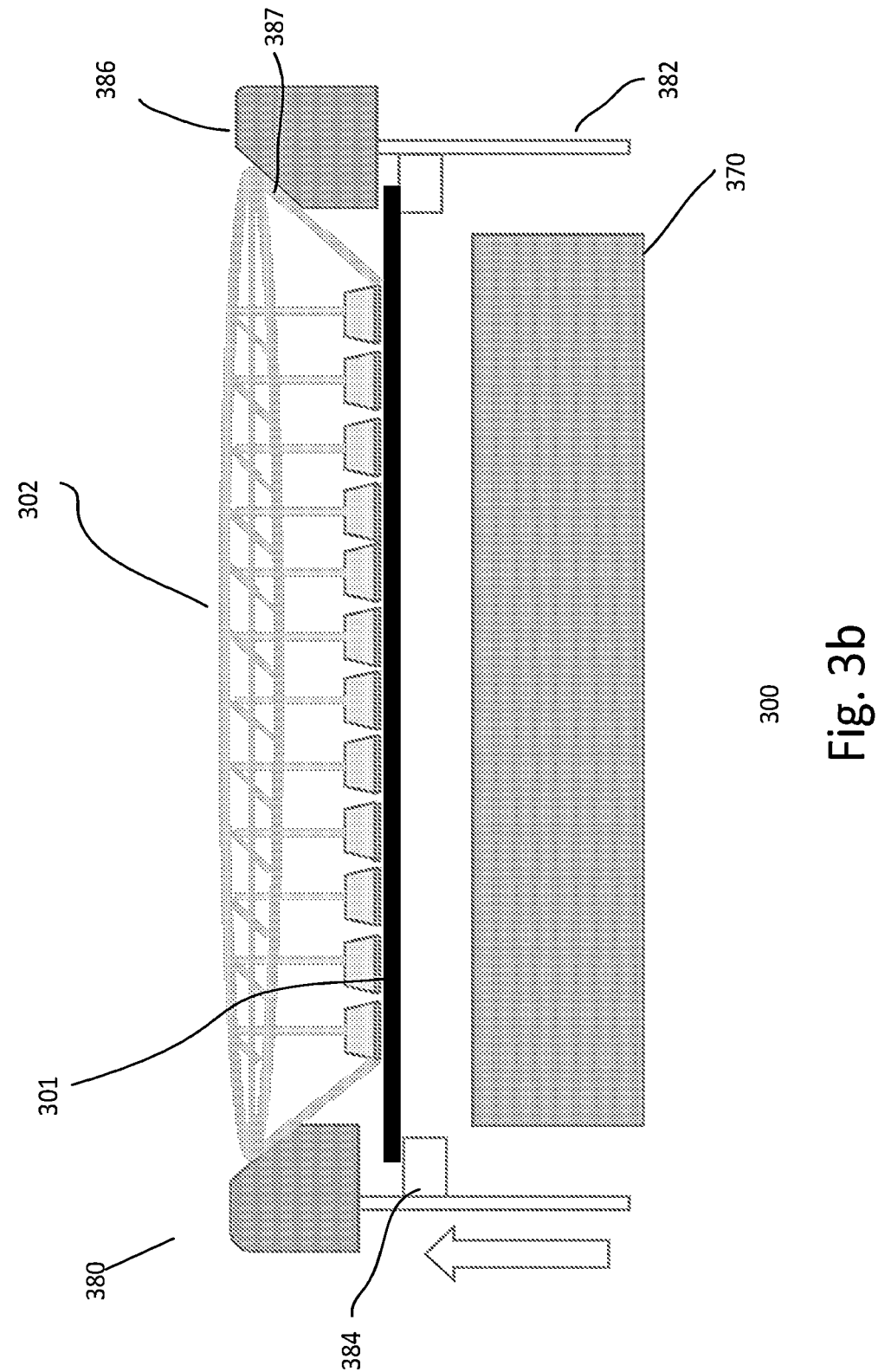
Figure 3C:
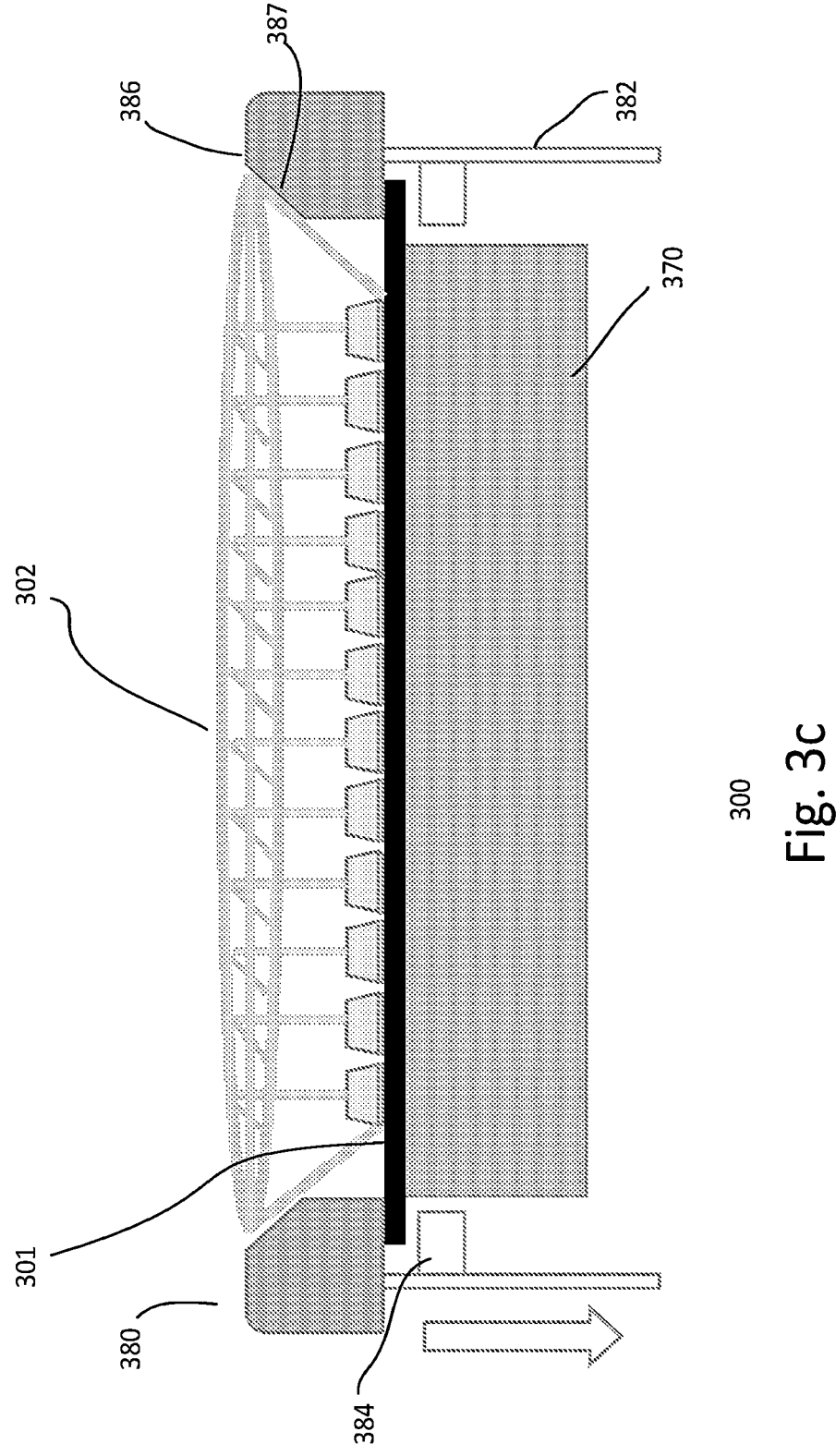

FIGS. 3a-3c show simplified views illustrating plasma dicing of a wafer in a plasma etch chamber 300 of a plasma wafer dicing tool. The plasma dicing employs a frame mask 302, such as those or similar to those described in FIGS. 2a-2c, configured for the plasma dicing tool to serve as a plasma etch mask for singulating a wafer into individual blank dies. Common elements may not be described or described in detail.

As shown in FIGS. 3a-3c, the plasma etch chamber includes a frame lift assembly 380 and an Electrostatic Chuck (ESC) 370. The frame lift assembly includes a lift frame 382. The lift frame is configured with a wafer frame assembly holder 384. The wafer frame assembly holder is configured to hold a wafer frame assembly 301 with a wafer attached thereto in position in the plasma etch chamber. A frame lift ring 386 is disposed on the top of the lift frame. As shown, the cross-sectional profile of the frame lift ring includes a slanted surface at the inner circumference thereof. For example, an upper portion of the frame lift ring includes the slanted sidewall surface while the lower portion of the frame lift ring includes a vertical sidewall surface. Other configurations of the inner sidewall surface of the frame lift ring may also be useful.

As shown in FIG. 3a, the frame lift assembly is configured to be in a non-etching position. For example, the frame lift assembly is in an elevated position. In the elevated position, the wafer frame assembly is disposed above the ESC table. For example, the wafer frame is not sitting on and held into position by the ESC table for plasma etching.

Referring to FIG. 3b, a frame mask 302 is disposed onto the frame lift ring 386. As shown, sides of the frame mask are configured to fit onto the slanted sidewall surface 387. A bottom of the frame mask is disposed over the wafer on the wafer frame assembly. In particular, the mask segments of the frame mask sit over the wafer.

As shown in FIG. 3c, the frame lift assembly with the frame mask and wafer frame assembly with the wafer is lowered into position for plasma dicing. In one embodiment, the wafer frame assembly is held into position by the ESC table when the wafer frame assembly is lowered into position for plasma dicing.

Figure 4A:
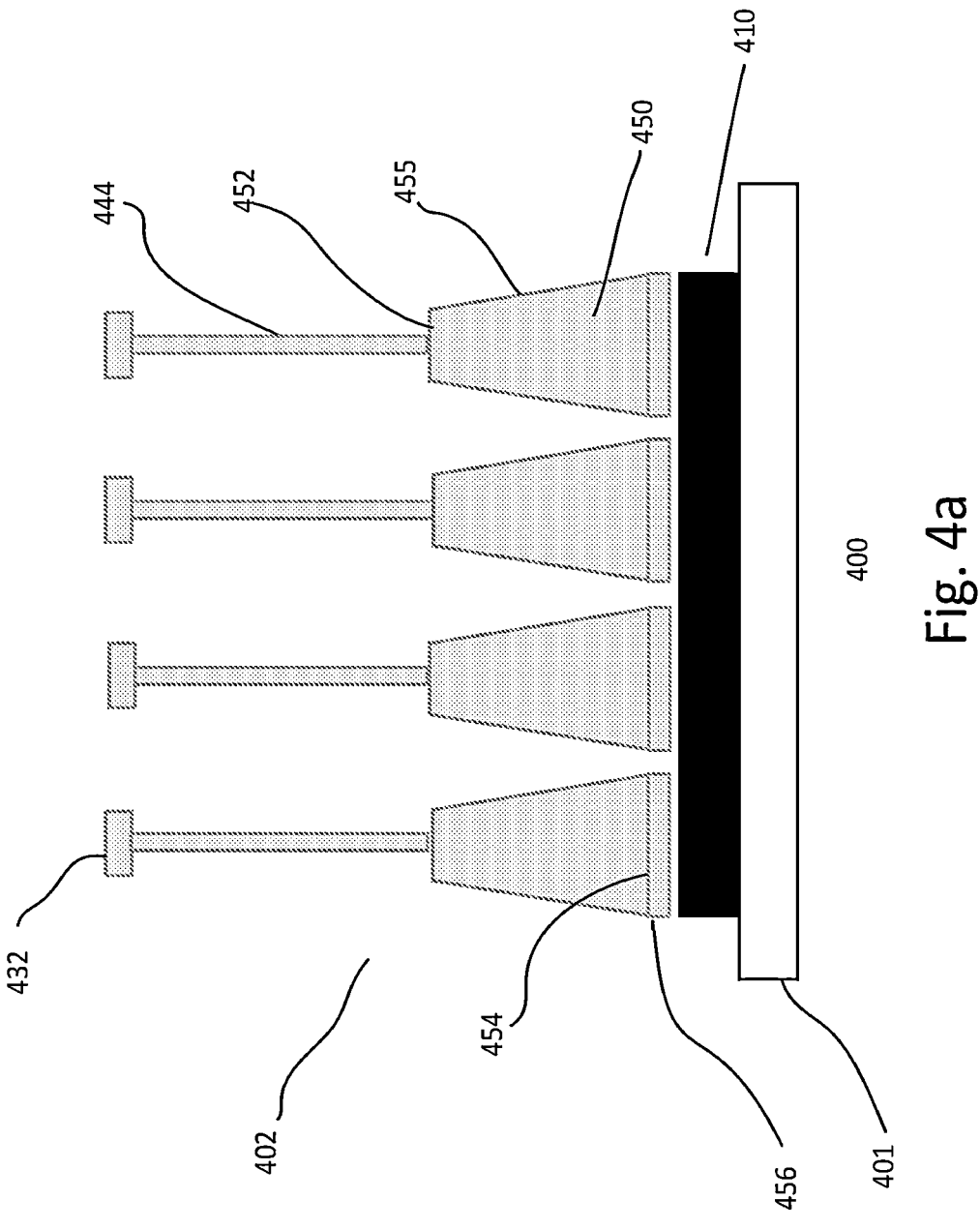
FIGS. 4a-4b show simplified cross-sectional views of an embodiment of a plasma etch process for dicing a wafer on a wafer frame assembly using a frame mask.
Figure 4B:
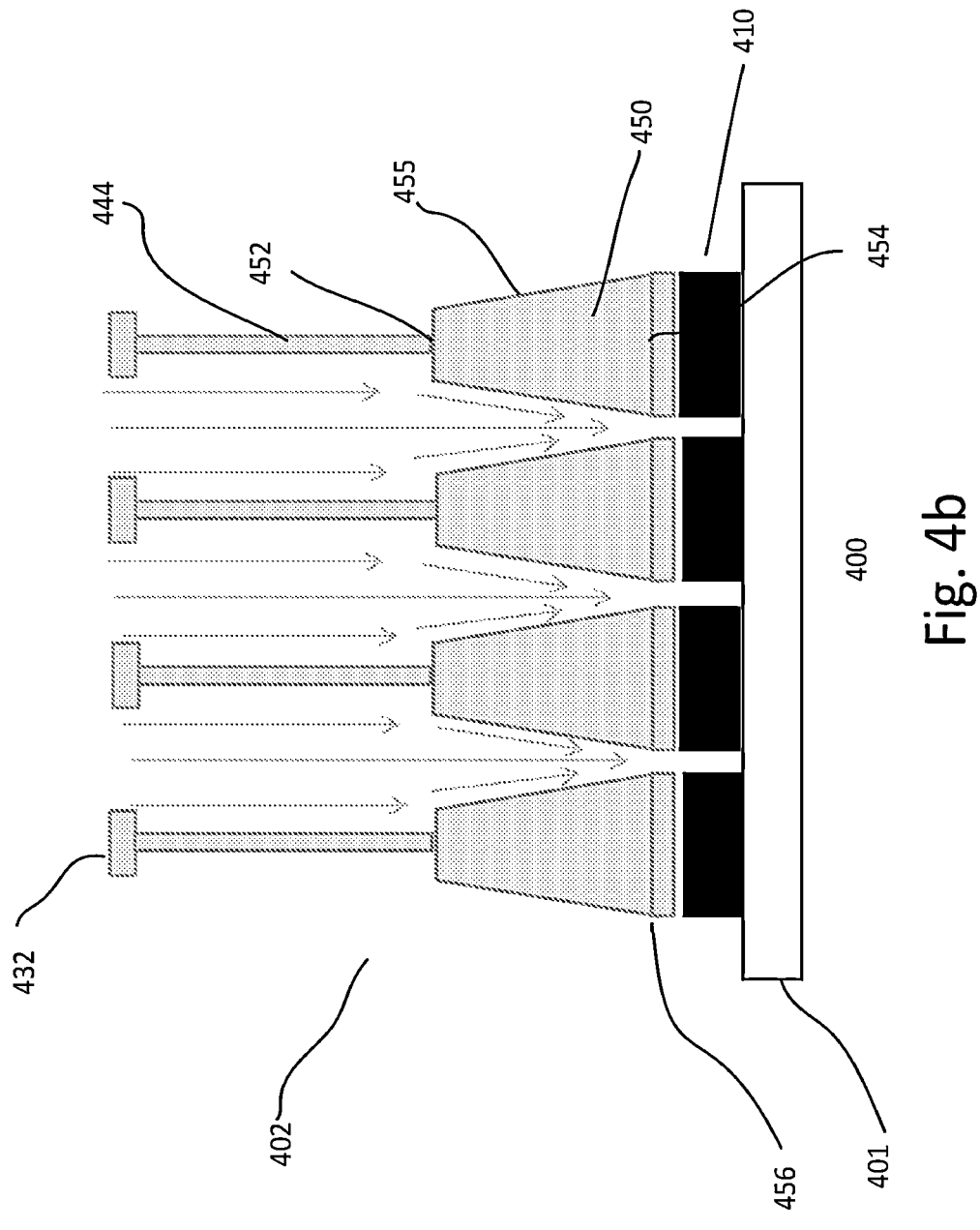

FIGS. 4a-4b show cross-sectional views of an embodiment of a plasma etch process 400 for dicing a wafer 410 on a wafer frame assembly 401 using a frame mask 402. The wafer frame assembly with the wafer may be the same or similar to those described in FIG. 1b and the frame mask may be the same or similar to those described in FIGS. 2a-2c. As for the plasma wafer dicing process, it may employ a plasma chamber similar to that described in FIGS. 3a-3c. Common components may not be described or described in detail.

As shown in FIG. 4a, a frame mask 402 is disposed over a wafer frame assembly 401 with a wafer 410. The frame mask 402 includes a plurality of mask segments 450. The mask segments include planar or substantially planar opposing top and bottom major surfaces 452 and 454 and side walls 455. The top major surface has a smaller area than the bottom major surface, resulting in outwardly sloped profiles of the side walls 455. The outwardly sloped profiles of the side walls facilitate plasma passing through the mask segments during processing. A cap layer 456 is disposed on the bottom major surface of the mask segments. For example, the cap layer is a heat resistant cap layer, such as a high temperature silicone rubber material layer. Other heat resistant cap layers may also be useful.

A mask frame supports the mask segments. In one embodiment, the mask segment includes a top ring support with ring support members 432. The mask segments are suspended from the ring support members via segment supports 444.

As shown in FIG. 4b, plasma passes through the mask segments, as indicated by arrows. The slanted side walls of the mask segments facilitate plasma passing through to etch the wafer below, singulating it into individual blank dies.

Figure 5:
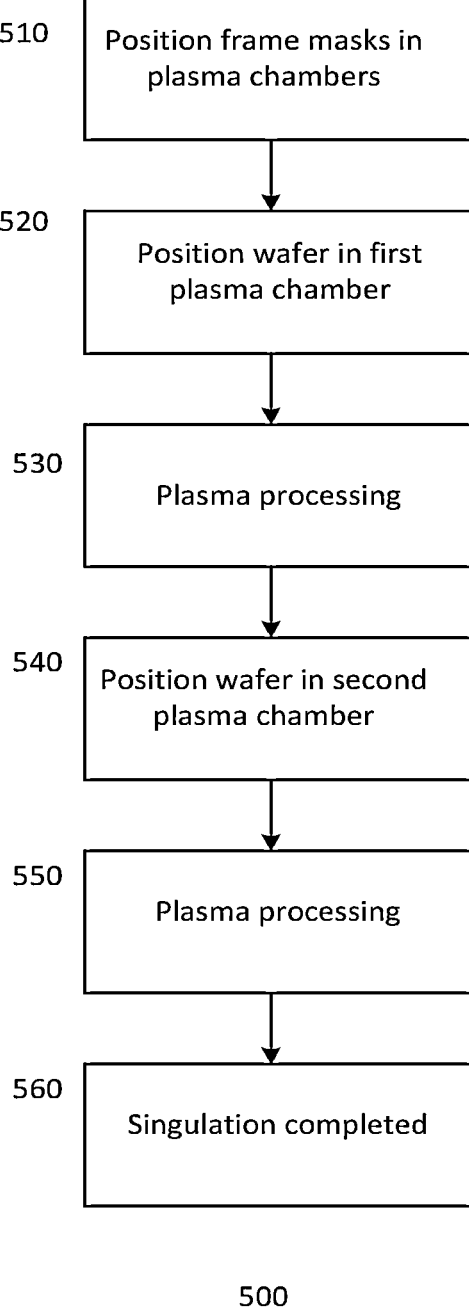
FIG. 5 shows a simplified process flow for an embodiment of plasma processing utilizing frame masks.

FIG. 5 shows a simplified process flow of an embodiment of plasma dicing of a blank wafer attached on a wafer frame assembly using a frame mask. The wafer frame assembly is the same or similar to those described in FIG. 1b. The frame mask is the same or similar to those described in FIGS. 2a and 2c. As for the plasma dicing process, it may be similar to those described in FIGS. 4a-4b, employing a plasma chamber similar to that described in FIGS. 3a-3c. Common components may not be described or described in detail.

The plasma dicing process involves a two-step plasma singulation process for singulating a blank wafer into individual blank dies. For example, a first etch process is performed in a first plasma chamber to form first directional cuts (x-direction or y-direction) and a second etch process is performed in a second plasma chamber to form second directional cuts (y-direction or x-direction) to complete the plasma singulation process. The wafer frame is configured to enable plasma to pass through the frame mask to etch the wafer.

In one embodiment, the frame mask includes a mask frame. The mask frame is configured to support mask segments which define plasma dicing channels in the first or second direction. For example, the mask segments are elongated members separated by spaces defining the plasma dicing channels. The mask segments are elongated rectangular-shaped members. For example, the mask segments are configured to form rectangular-shaped blank dies. Forming other shaped blank dies may be achieved by tuning the shapes of the mask segments.

At 510, the singulation process commences with providing a first frame mask positioned in a first plasma chamber and a second frame mask positioned in a second plasma chamber. For example, the first frame mask is fitted onto a frame lift ring of a frame lift assembly in the first plasma chamber, the second frame mask is fitted onto a frame lift ring of a frame lift assembly in the second plasma chamber. The first frame mask is configured to provide plasma dicing channels in the first direction, the second frame mask is configured to provide plasma dicing channels in the second direction. For example, the second frame mask is positioned orthogonal to the first frame mask.

At 520, a wafer frame assembly with a blank wafer is placed over a wafer frame holder of a frame lift assembly in the first plasma chamber. The frame lift assembly is configured to be in a non-etching position. For example, the frame lift assembly is in an elevated position. In the elevated position, the wafer frame assembly is disposed above an ESC table. For example, the wafer ring is not sitting on and held into position by the ESC table for plasma etching.

The lift frame assembly with the frame mask and wafer frame assembly with the wafer is lowered into position for plasma dicing, at 530. In one embodiment, the wafer assembly is held into position by the ESC table when the wafer assembly is lowered into position for plasma dicing the wafer in position for plasma dicing in the first direction.

Referring to 540, the wafer frame assembly with the wafer plasma processed in the first direction is transferred and placed over a wafer frame holder of a frame lift assembly in the second plasma chamber. For example, the wafer frame assembly with the wafer is transferred and positioned with no rotation since the second frame mask is configured to provide plasma dicing channels in the second direction. The frame lift assembly is configured to be in a non-etching position. For example, the frame lift assembly is in an elevated position. In the elevated position, the wafer frame assembly is disposed above an ESC table. For example, the wafer ring is not sitting on and held into position by the ESC table for plasma etching.

The lift frame assembly with the frame mask and wafer frame assembly with the wafer is lowered into position for plasma dicing, at 550. In one embodiment, the wafer assembly is held into position by the ESC table when the wafer assembly is lowered into position for plasma dicing the wafer in position for plasma dicing in the second direction.

At 560, the two-step plasma dicing process completes after the singulation in the second direction. The etch process singulates the blank wafer into individual blank dies according to the shape of the segment blocks of the frame mask. In one embodiment, the singulation process using the frame mask produces individual dies with smooth and straight sidewalls.

Figure 6:
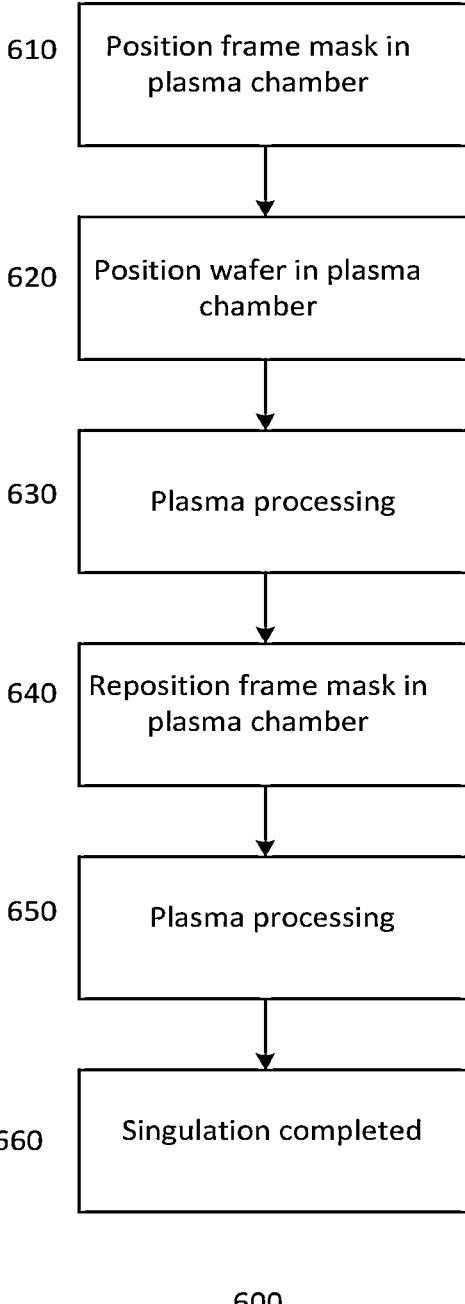
FIG. 6 shows a simplified process flow for another embodiment of plasma processing utilizing frame masks.

FIG. 6 shows a simplified process flow of another embodiment of plasma dicing of a blank wafer using a frame mask. The wafer frame assembly is the same or similar to those described in FIG. 1b. The frame mask is the same or similar to those described in FIGS. 2a and 2c. As for the plasma dicing process, it may be similar to those described in FIGS. 4a-4b, employing a plasma chamber similar to that described in FIGS. 3a-3c. Common components may not be described or described in detail.

The plasma dicing process illustrated in FIG. 6 also involves a two-step plasma singulation process for singulating a blank wafer into individual blank dies. However, it is different from the singulation process as illustrated in FIG. 5 in that the two-step plasma singulation process is performed in the same plasma chamber via rotating the frame mask. For example, a first etch process is performed in a plasma chamber to form first directional cuts (x-direction or y-direction) and a second etch process in which the frame mask is rotated by 90° is performed in the same plasma chamber to form second directional cuts (y-direction or x-direction) to complete the plasma singulation process. The wafer frame is configured to enable plasma to pass through the frame mask to etch the wafer.

In one embodiment, the frame mask includes a mask frame. The mask frame is configured to support mask segments which defines plasma dicing channels in the first direction. For example, the mask segments are elongated members separated by spaces defining the plasma dicing channels. The mask segments are elongated rectangular-shaped members. For example, the mask segments are configured to form rectangular-shaped blank dies. Forming other shaped blank dies may be achieved by tuning the shapes of the mask segments.

At 610, the singulation process commences with providing a frame mask positioned in a plasma chamber. For example, the frame mask is fitted onto a frame lift ring of a frame lift assembly in the plasma chamber. The frame mask is configured to provide plasma dicing channels in the first direction.

At 620, a wafer frame assembly with a blank wafer is placed over a wafer frame holder of a frame lift assembly in the plasma chamber. The frame lift assembly is configured to be in a non-etching position. For example, the frame lift assembly is in an elevated position. In the elevated position, the wafer frame assembly is disposed above an ESC table. For example, the wafer ring is not sitting on and held into position by the ESC table for plasma etching.

The lift frame assembly with the frame mask and wafer frame assembly with the wafer is lowered into position for plasma dicing, at 630. In one embodiment, the wafer assembly is held into position by the ESC table when the wafer assembly is lowered into position for plasma dicing the wafer in position for plasma dicing in the first direction.

Referring to 640, the frame mask is repositioned onto the frame lift ring of the frame lift assembly in the plasma chamber. For example, the frame mask is rotated by 90° to provide plasma dicing channels in the second direction. The frame lift assembly is configured to be in a non-etching position. For example, the frame lift assembly is in an elevated position. In the elevated position, the wafer frame assembly is disposed above an ESC table. For example, the wafer ring is not sitting on and held into position by the ESC table for plasma etching.

The lift frame assembly with the frame mask and wafer frame assembly with the wafer is lowered into position for plasma dicing, at 650. In one embodiment, the wafer assembly is held into position by the ESC table when the wafer assembly is lowered into position for plasma dicing the wafer in position for plasma dicing in the second direction.

At 660, the two-step plasma dicing process completes after the singulation in the second direction. The etch process singulates the blank wafer into individual blank dies according to the shape of the segment blocks of the frame mask. In one embodiment, the singulation process using the frame mask produces individual dies with smooth and straight sidewalls.

Figure 7:
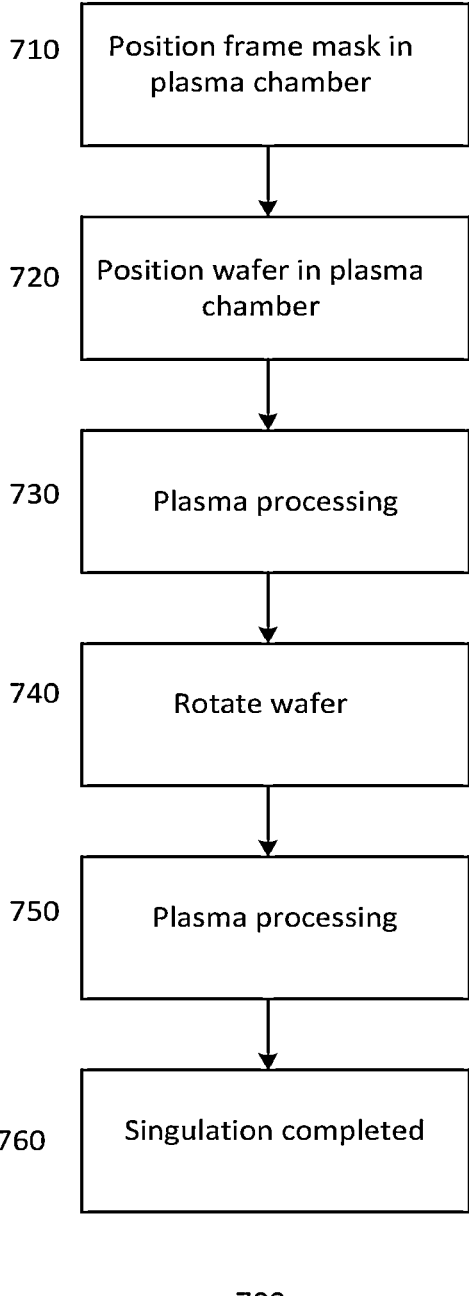
FIG. 7 shows a simplified process flow for another embodiment of plasma processing utilizing frame masks.

FIG. 7 shows a simplified process flow of another embodiment of plasma dicing of a blank wafer using a frame mask. The wafer frame assembly is the same or similar to those described in FIG. 1*b*. The frame mask is the same or similar to those described in FIGS. 2*a* and 2*c*. As for the plasma dicing process, it may be similar to those described in FIGS. 4*a*-4*b*, employing a plasma chamber similar to that described in FIGS. 3*a*-3*c*. Common components may not be described or described in detail.

The plasma dicing process illustrated in FIG. 7 also involves a two-step plasma singulation process for singulating a blank wafer into individual blank dies. However, it is different from the singulation process as illustrated in FIGS. 5 and 6 in that the two-step plasma singulation process is performed via rotating the wafer in the same plasma chamber. For example, a first etch process is performed in a plasma chamber to form first directional cuts (x-direction or y-direction) and a second etch process in which the wafer is rotated by 90° is performed in the same plasma chamber to form second directional cuts (y-direction or x-direction) to complete the plasma singulation process. The wafer frame is configured to enable plasma to pass through the frame mask to etch the wafer.

In one embodiment, the frame mask includes a mask frame. The mask frame is configured to support mask segments which defines plasma dicing channels in the first direction. For example, the mask segments are elongated members separated by spaces defining the plasma dicing channels. The mask segments are elongated rectangular-shaped members. For example, the mask segments are configured to form rectangular-shaped blank dies. Forming other shaped blank dies may be achieved by tuning the shapes of the mask segments.

At 710, the singulation process commences with providing a frame mask positioned in a plasma chamber. For example, the frame mask is fitted onto a frame lift ring of a frame lift assembly in the plasma chamber. The frame mask is configured to provide plasma dicing channels in the first direction.

At 720, a wafer frame assembly with a blank wafer is placed over a wafer frame holder of the frame lift assembly in the plasma chamber. The frame lift assembly is configured to be in a non-etching position. For example, the frame lift assembly is in an elevated position. In the elevated position, the wafer frame assembly is disposed above an ESC table. For example, the wafer ring is not sitting on and held into position by the ESC table for plasma etching.

The lift frame assembly with the frame mask and wafer frame assembly with the wafer is lowered into position for plasma dicing, at 730. In one embodiment, the wafer assembly is held into position by the ESC table when the wafer assembly is lowered into position for plasma dicing the wafer in position for plasma dicing in the first direction.

Referring to 740, the wafer frame assembly with wafer is rotated by 90° relative to the frame mask disposed over the wafer. As such, the frame mask defines plasma dicing channels in the second direction. The frame lift assembly is configured to be in a non-etching position. For example, the frame lift assembly is in an elevated position. In the elevated position, the wafer frame assembly is disposed above an ESC table. For example, the wafer frame is not sitting on and held into position by the ESC table for plasma etching.

The lift frame assembly with the frame mask and wafer frame assembly with the wafer is lowered into position for plasma dicing, at 750. In one embodiment, the wafer assembly is held into position by the ESC table when the wafer assembly is lowered into position for plasma dicing the wafer in position for plasma dicing in the second direction.

At 760, the two-step plasma dicing process completes after the singulation in the second direction. The etch process singulates the blank wafer into individual blank dies according to the shape of the segment blocks of the frame mask. In one embodiment, the singulation process using the frame mask produces individual dies with smooth and straight sidewalls.

Figure 8:
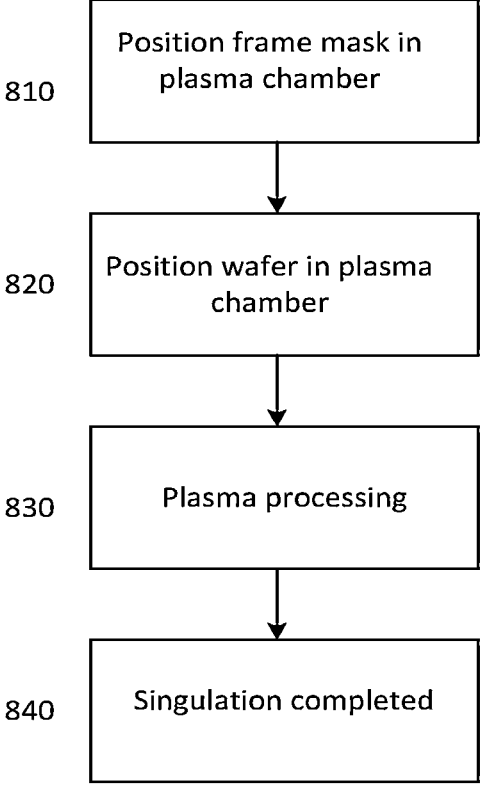
FIG. 8 shows a simplified process flow for yet another embodiment of plasma processing utilizing frame masks.

FIG. 8 shows a simplified process flow of yet another embodiment of plasma dicing of a blank wafer using a frame mask. The wafer frame assembly is the same or similar to those described in FIG. 1*b*. The frame mask is the same or similar to those described in FIGS. 2*b* and 2*c*. As for the plasma dicing process, it may be similar to those described in FIGS. 4*a*-4*b*, employing a plasma chamber similar to that described in FIGS. 3*a*-3*c*. Common components may not be described or described in detail.

The plasma dicing process illustrated in FIG. 8 involves a single-step plasma singulation process for singulating a blank wafer into individual blank dies. For example, the single plasma etch process singulates the wafer into individual blank dies. The wafer frame is configured to enable plasma to pass through the frame mask to etch the wafer.

In one embodiment, the frame mask includes a mask frame. The mask frame is configured to support mask segments which are configured to define plasma dicing channels in first and second orthogonal directions (x-direction and y-direction). In one embodiment, mask segments include first direction mask segments (e.g., x-direction) and second direction mask segments (e.g., y-direction), forming first direction dicing channels and second direction dicing channels. The mask segments produce mask segment blocks corresponding to blank dies. For example, the mask segment blocks, after dicing, singulates the blank wafer into blank dies. The shape of the mask segment blocks corresponds to the shape of the blank dies.

At 810, the singulation process commences with providing a frame mask positioned in a plasma chamber. For example, the frame mask is fitted onto a frame lift ring of a frame lift assembly in the plasma chamber.

At 820, a wafer frame assembly with a blank wafer is placed over a wafer frame holder of the frame lift assembly in the plasma chamber. The frame lift assembly is configured to be in a non-etching position. For example, the frame lift assembly is in an elevated position. In the elevated position, the wafer frame assembly is disposed above an ESC table. For example, the wafer ring is not sitting on and held into position by the ESC table for plasma etching.

The lift frame assembly with the frame mask and wafer frame assembly with the wafer is lowered into position for plasma dicing, at 830. In one embodiment, the wafer assembly is held into position by the ESC table when the wafer assembly is lowered into position for plasma dicing the wafer in position for plasma dicing.

The single-step plasma dicing process completes at 840. The etch process singulates the blank wafer into individual blank dies according to the shape of the segment blocks of the frame mask. In one embodiment, the singulation process using the frame mask produces individual dies with smooth and straight sidewalls.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A frame mask for plasma dicing wafers comprising:
a mask frame, wherein the mask frame includes
   a top ring mask support,
   a side ring mask support;
a plurality of mask segments which are suspended from the top ring mask support by segment supports, the segment supports connect the mask segments to the top ring mask support, wherein spaces between the mask segments define dicing channels on a blank wafer; and
wherein
   the frame mask is configured to removably sit onto a frame lift assembly in a plasma chamber of a plasma dicing tool, when fitted onto the frame lift assembly, the mask segments are disposed above a wafer on a wafer ring frame for plasma dicing,
   the mask frame is configured to enable flow of plasma therethrough to the wafer to dice the wafer along dicing channels defined by the spaces between the mask segments, and
   the mask frame, including the mask segments, is not eroded by the flow of plasma used in dicing the wafer.

2. The frame mask of claim 1, wherein the top ring mask support includes top ring mask support members from which the mask segments are suspended.

3. The frame mask of claim 1, wherein the mask segments include a top and a bottom major mask segment surfaces with side mask segment surfaces, the top major mask segment surface is smaller than the bottom major mask segment surface, the side mask segment surfaces have an outwardly sloped profile.

4. The frame mask of claim 3, wherein the mask segments include elongated mask segment members in a first direction, and gaps between adjacent mask segments define dicing channels in the first direction.

5. The frame mask of claim 3, wherein the mask segments include grid-patterned mask segment members in first and second directions, and spaces between adjacent mask segments define the dicing channels on the wafer in the first and second directions for dicing the wafer.

6. The frame mask of claim 1, wherein the side ring mask support has an inwardly sloped profile configured to be fitted onto the frame lift assembly.

7. The frame mask of claim 6, wherein the frame lift assembly includes a frame lift ring on a top of the frame lift assembly, the frame lift ring has an outwardly sloped inner side surface which is complementary with the inwardly sloped profile of the side ring mask support.

8. The frame mask of claim 6, wherein the mask frame further comprises a bottom ring mask support surrounding the mask segments, the bottom ring mask support is smaller than the top ring mask support, the side ring mask support extends from the top ring mask support to the bottom ring mask support.

9. The frame mask of claim 3, the frame mask further comprises a cap layer disposed on the bottom major mask segment surface of the mask segments.

10. The frame mask of claim 9, wherein the cap layer is a heat resistant layer.

11. The frame mask of claim 10, wherein the cap layer is a high temperature silicone rubber material layer.

12. The frame mask of claim 1, wherein the frame mask is formed of the same material as the frame lift assembly to avoid thermal mismatch.

13. The frame mask of claim 12, wherein the frame mask and the frame lift assembly are formed of Aluminium (Al).

14. A frame mask for plasma dicing wafers comprising:
a mask frame, wherein the mask frame includes
   a top ring mask support,
   a side ring mask support,
   a bottom ring mask support;
a plurality of mask segments suspended from the top ring mask support by segment supports, the segment supports connect the mask segments to the top ring mask support, the mask segments are disposed along first and second orthogonal directions to form a grid pattern, wherein spaces between the mask segments define dicing channels on a blank wafer in the first and second orthogonal directions, wherein the mask segments include a top and a bottom major mask segment surfaces with side mask segment surfaces, the top major mask segment surface is smaller than the bottom major mask segment surface, the side mask segment surfaces have an outwardly sloped profile;
a cap layer disposed on the bottom major mask segment surface of the mask segments; and
wherein
   the frame mask is configured to removably sit onto a frame lift assembly in a plasma chamber of a plasma dicing tool, when fitted onto the frame lift assembly, the mask segments are disposed above a wafer on a wafer ring frame for plasma dicing, and
   the mask frame is configured to enable flow of plasma therethrough to the wafer to dice the wafer along dicing channels defined by the spaces between the mask segments, and
   the mask frame, including the mask segments, is not eroded by the flow of plasma used in dicing the wafer.

15. The frame mask of claim 14, wherein the side ring mask support has an inwardly sloped profile configured to be fitted onto the frame lift assembly.

16. The frame mask of claim 15, wherein the frame lift assembly includes a frame lift ring on a top of the frame lift assembly, the frame lift ring has an outwardly sloped inner side surface which is complementary with the inwardly sloped profile of the side ring mask support.

17. The frame mask of claim 15, wherein the mask frame further comprises the bottom ring mask support surrounding the mask segments, the bottom ring mask support is smaller than the top ring mask support, the side ring mask support extends from the top ring mask support to the bottom ring mask support.

18. The frame mask of claim 14, wherein the cap layer is a heat resistant layer.

19. The frame mask of claim 14, wherein the frame mask is formed of the same material as the frame lift assembly to avoid thermal mismatch.

* * * * *